United States Patent
Kemlage et al.

[11] 3,963,539
[45] June 15, 1976

[54] TWO STAGE HETEROEPITAXIAL DEPOSITION PROCESS FOR GaAsP/Si LED'S

[75] Inventors: Bernard M. Kemlage, Kingston, N.Y.; Jerry M. Woodall, Saratoga, Calif.; William C. Wuestenhoefer, Mahopac, N.Y.

[73] Assignee: International Business Machines Corporation, Armonk, N.Y.

[22] Filed: Dec. 17, 1974

[21] Appl. No.: 533,590

[52] U.S. Cl. ............... 148/175; 156/610; 156/612; 156/613; 156/614; 357/16; 357/17; 357/60; 357/88
[51] Int. Cl.² ............. H01L 21/205; H01L 33/00
[58] Field of Search .......... 148/175; 156/610, 612, 156/613, 614; 357/16, 17, 60, 88

[56] References Cited
UNITED STATES PATENTS

| | | | |
|---|---|---|---|
| 3,433,684 | 3/1969 | Zanowick et al. | 357/16 X |
| 3,508,962 | 4/1970 | Manasevit et al. | 156/612 X |
| 3,699,401 | 10/1972 | Tietjen et al. | 357/16 X |
| 3,766,447 | 10/1973 | Mason | 148/175 X |
| 3,783,009 | 1/1974 | Tramposch | 148/175 X |
| 3,839,082 | 10/1974 | Kasano et al. | 148/175 X |
| 3,862,859 | 1/1975 | Ettenberg et al. | 148/175 X |

OTHER PUBLICATIONS

Broadie et al., "Selective Planar GaP/Si ... Diodes" I.B.M. Tech. Discl. Bull., vol. 16, No. 4, Sept. 1973, p. 1301.
Berkenblit et al., "Reduction of Stress ... Hetero--Epitaxial Layers" IBID., vol. 12, No. 9, Feb. 1970, p. 1489.
Blum et al., "Vapor Growth of GaP onto Si Substrates" IBID., vol. 13, No. 5, Oct. 1970, p. 1245.
Ladany et al., "Two-Stage Epitaxial ... GaAs ... on Spinel" J. Applied Physics, vol. 43, No. 1, Jan. 1972. p. 236–238.

*Primary Examiner*—L. Dewayne Rutledge
*Assistant Examiner*—W. G. Saba
*Attorney, Agent, or Firm*—Sughrue, Rothwell, Mion, Zinn & Macpeak

[57] ABSTRACT

A process for producing light emitting diodes is disclosed. In the process a primer layer of GaP is pyrolytically deposited on a Si substrate with the resulting epitaxial film thickness being sufficient to form complete coalescence of the epitaxial nuclei, but thin enough to avoid cracks in the epitaxial layer due to stress induced by thermal expansion. The thickness is generally between $1-2\mu$. A second layer of GaP is then deposited using the standard halide transport process with thicknesses of $10-20\mu$ with the graded addition of $AsH_3$, until the particularly desired design composition of GaAsP is obtained. A constant layer of GaAsP is grown on the graded layer.

6 Claims, 3 Drawing Figures

TWO STAGE HETEROEPITAXIAL DEPOSITION PROCESS FOR GAASP/SI LED'S

BACKGROUND OF THE INVENTION

1. Field of the Invention

The invention disclosed and claimed herein is in the field of semiconductor devices and processes for the manufacture thereof. Specifically, the invention is directed toward the preparation of light emitting diodes (LED's) by the epitaxial growth of gallium arsenic phosphide (GaAsP) on silicon (Si) substrates.

2. Prior Art

The literature is replete with report covering heteroepitaxial deposition studies encompassing various types of film-substrate systems and the structures produced have been generally intended for use in further examination of heterojunction devices such as heterodiodes, or for the fabrication of devices onto the epitaxial film. In the latter case, the substrate is normally chosen on a basis of economics or because of certain properties and tends to act merely as a support for the film. One potentially fruitful area of heteroepitaxial study is that of epitaxial LED material deposited on silicon substrates, primarily because of the wide availability of large area, high quality and relatively low cost silicon substrates. A series of different deposition processes have been attempted to achieve monolithic integration of GaP LED's on silicon substrates leading to the growth of LED compositions.

The halide transport process [Ga-PCl$_3$ - (88% H$_2$, 12% H$_2$)] was used by Kesperis et al and reported June, 1964 [Technical Report ECOM-2471, "Research on Heterojunctions", U.S. Army Electronics Command]. Difficulties, mainly due to the formation of SiO$_2$ on the silicon substrate, were experienced. The typical growth temperature was 700°–750°C and the utilization of slow growth rates, on the order of 0.7 $\mu$/min. were found to retard film cracking in layers up to 22 $\mu$ thick. A slightly different halide transport system, employing GaP and PCl$_3$ as the source materials, has been recently reported by Huber and Winstel ["Growth of Heteroepitaxial GaP on Si Substrates by a Chloride Transport Process", Siemens Forsch - n. Entwickl - Ber. Bd 2 (1973), No. 3]. This research also experienced deposition difficulties due to the presence of oxide on the silicon substrates and successful depositions, at about 800°–850°C, were achieved on <110> substrates but not on <100> substrates provided the silicon substrates underwent a specific high temperature H$_2$ bake cycle.

The use of a close spaced evaporation technique has been disclosed by Igarashi ["Heteroepitaxial Growth of GaP and Si Substrates by Evaporation Method", J. Applied Physics 41, 3190 (1970); "Selective Growth of Heteroepitaxial GaP on Si Substrates", J. Electrochem Soc., Vol. 119, p. 1430, (1972)]. Depositions into SiO$_2$ holes (about 70 × 200 $\mu$) were crack free, so long as the depositions were less than 5 $\mu$ thickness. Also, Thomas ["Growth of Single Crystal GaP from Organometallic Sources", J. Electrochem Soc., Vol. 116, No. 10, p. 1449 (1969)] has reported on the pyrolysis technique at the lowest reported growth temperature (485°C). However, the growth rate (0.0025$\mu$/min.) and film thickness (0.5$\mu$) were of little practical use for GaP diode applications.

Other process methods such as closed tube transport [Hoack and Mohling, "Epitaxial Layers of Gallium Phosphide on Silicon", Phys. Stat. Sol. 3A K229 (1970)], eutectic growth [Rosztoczy and Stein, "The Growth of Ge-GaAs and GaP-Si Heterojunctions by Liquid Phase Epitaxy", J. Electrochem Soc., Vol. 119, No. 8, p. 1119 (1972)] and electrolytic depositions [Cuomo and Gambins, "The Synthesis and Epitaxial Growth of GaP by Fused Salt Electrolysis", J. Electrochem Soc., Vol. 115, No. 7 (1967)] have been used to study the GaP on Si heterosystem, but these tend not to lend themselves very readily to any large scale, practical production methods.

Similarly, prior art patents such as Ruerwein, U.S. Pat. No. 3,312,570; LaChapelle, U.S. Pat. No. 3,582,410; and Yu, U.S. Pat. No. 3,366,517 relate to studies for establishing appropriate conditions for achieving heteroepitaxial growths. Very few material characteristics have been reported in the prior art because most material was not suitable for such measurement and analysis. The available data is restricted to commonly observed film cracking along cleavage planes, Hall measurements and cursory structural and optical data. The patent to Mason, U.S. Pat. No. 3,766,447 attempts to overcome the problem of the mismatch between Si and GaP by the use between the two of a graded alloy layer consisting of silicon with a germanium (Ge) concentration ranging from zero at the junction with the Si substrate to about 8% at the junction with the GaP layer. The prior art as represented by Mason moves away from the desired goal of direct epitaxial deposition of an electroluminescent semiconductor on silicon in attempts to achieve a commercially viable product by compromising, in the process, characteristics of the materials to reach a satisfactory result.

SUMMARY OF THE INVENTION

In its simplest terms, the present invention defines a process for the production of epitaxial GaAsP deposits on Si substrates to be used in the fabrication of LED's. A review of the prior art discussed above indicates that emphasis was placed on the use of either pyrolytic deposition or disproportionation. Individually, these processes are not successful in the formation of adequate epitaxial quality for efficient LED fabrication. In the case of pyrolytic depositions the resulting structural and electrical quality of the material is poor while significant difficulties with film nucleation on the Si substrates exist in the disproportionation system.

To date, only GaAs and GaP wafers have been used as substrates on which epitaxial layers of high quality have been achieved. Preferably, substrates of single crystal silicon are desired because of the cost differences between these crystals and those of GaAs and GaP. Furthermore, the extensive silicon device technology could also be taken advantage of by integrating it with the LED technology. This invention, by the unique combination of two deposition techniques, makes possible the direct growth of good epitaxial quality GaP as well as GaAsP on a Si substrate.

The process of the present invention comprises first pyrolytically depositing GaP [in the range of 1–2 $\mu$ thick] on a silicon substrate to serve as a primer layer. This process step permits ready nucleation on Si substrates when initiated above 900°C; however, the electrical properties of even thick films produced in this manner are quite inadequate for LED purposes. Accordingly, a second layer of GaP is deposited at 700°–750°C using a standard disproportionation deposition process. The second layer is approximately 10–20 μ in thickness and this process results in a high quality and relatively large area (~5–6mm²) crack free GaP material useful for LED fabrication.

To produce acceptable LED's of different wavelengths, the growth of the second GaP layer is continued with the band gap altered by the addition of AsH₃ to form GaAsP through the use of an electronic programmed metering device. The AsH₃ content is graded until the design composition of the LED is achieved; it is then maintained at that level for the growth of a constant composition. The resulting diode fabricated in such material (GaAs₆P₄) demonstrated an external quantum efficiency of 0.9%.

Accordingly, it is a first object of this invention to provide a process for producing low cost GaP on Si wafers to be used in the making of light emitting diodes.

It is a further object of this invention to provide a reliable and reproducible heteroepitaxial GaP deposition process on silicon substrates.

It is a further object of this invention to provide a heteroepitaxial GaP deposition process that will facilitate the growth of GaAsP on Si by the graded addition of AsH₃ to the growing GaP layer to produce different wavelength emitting LED's.

These and other objects of the present invention are explained in greater detail in the following material.

DETAILED DESCRIPTION OF THE PREFERRED EMBODIMENTS

Figure 1:
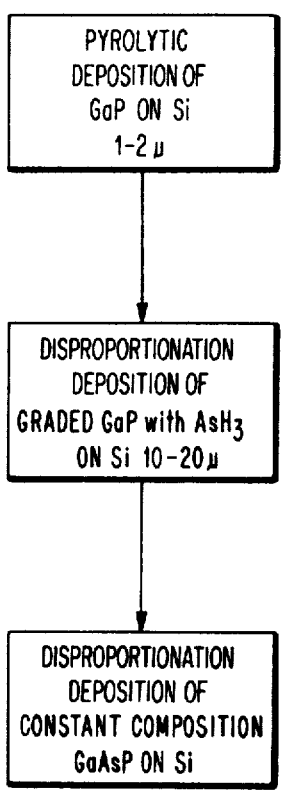
FIG. 1 is a block diagram of the process steps used in this invention.
Figure 3:
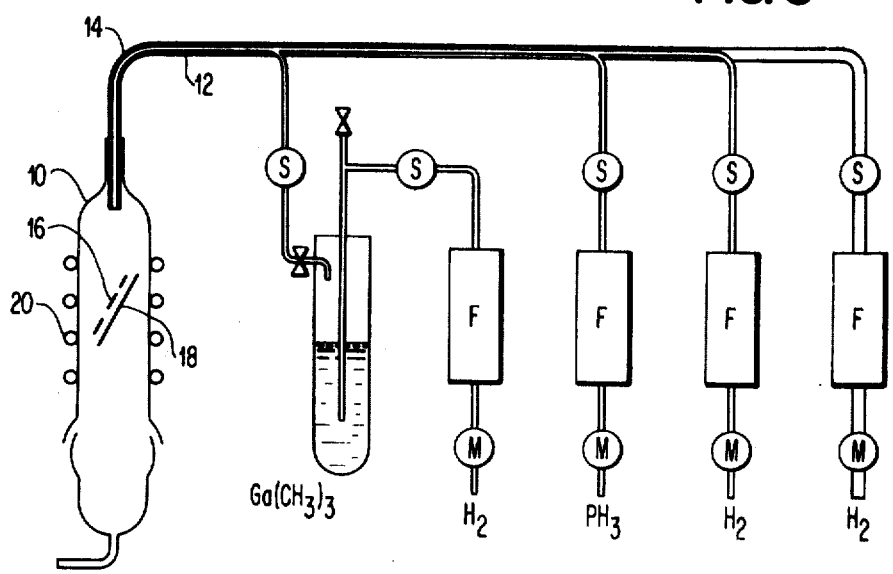
FIG. 3 is a schematic view of apparatus to be used for the pyrolytic growth of GaP on Si in accordance with the first step of this method.

According to the preferred method of practicing this invention, as shown in the block diagram of FIG. 1 the first step is the pyrolytic deposition of GaP on Si substrates to serve as a "primer". The reaction tube 10, typically quartz about 50mm in diameter, is conventionally positioned horizontally. However, it is used vertically in this process, as shown in FIG. 3, and the inlets consist of two tubes 12, 14. The internal inlet one 12 permits entrance of the reactant gases and the external one inlet 14 provides an H₂ curtain around the reactant gases to guide them to the deposition area with a minimal amount of excess deposit on the reactor walls. The substrates 16 are placed on an uncoated, high purity graphite pedestal 18 and are heated by an r.f. induction coil 20.

Metering valves M are used to control the flow of reactants, monitored by flow meters F and solenoid valve S to selectively turn on and off the flow of gases. A high temperature H₂ bake cycle of approximately 2 minutes at approximately 1100°C is essential as a precursor to pyrolytic deposition in order to successfully deposit continuous films. The pyrolytic process is then run until an epitaxial film of about 1–2 μ is deposited on the substrate. This film is a primed layer on the silicon substrate.

Typical conditions for such a run are presented in the following table:

Flow Rates
H₂ (main flow)                    3.0 l/min.
H₂[Ga(CH₃)₃ pick-up]              3.0 l/min.
H₂(PH₃ pick-up)                   2.5 l/min.
Ga(CH₃)₃                          25 cc/min.
PH₃                               25 cc/min.

Temperatures

1125°C – 1000°C – 850°C.

Times 2 min at 1125°C
3 min at Grade Temperature (1125°C → 1000°C)
1 min PH₃ at 1000°C
5 min PH₃ and Ga(CH₃)₃ at 1000°C
15 min PH₃ and Ga(CH₃)₃ at 850°C
8 min Flush The results of such a deposition will be an epitaxy of good quality on either Si <100> or 3° misoriented off the <100> plane, with a film of up to 7.5 μ thick. The basic equations for this pyrolytic process are:

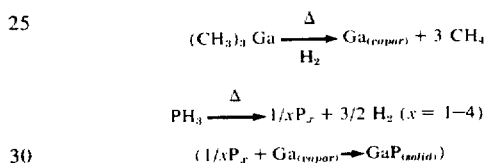

Additionally, it should be noted that to enhance the GaP formation in the region of high temperature, e.g., in the substrate 16 and the susceptor 18 area, a cold walled reactor is used. The final growth temperatures may be varied down to approximately 750°C and still yield acceptable results.

The second step in the preferred embodiment of this invention is to deposit a second layer of GaP to a thickness of approximately 10–20 μ using a standard and commercially available HCl/Ga/PH₃/H₂ deposition apparatus with the graded addition of AsH₃. Such device is shown and described in Casey, Jr. and Trumbore, "Single Crystal Electroluminescent Materials", Mater. Sci. Eng., 6 (1970) pp. 69–109 and the description need not be recited here. The basic equations for the above process are:

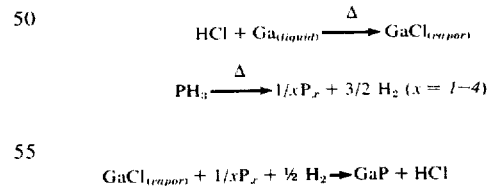

In such a system, the chamber walls are hot in order to prevent GaP formation on the walls. If the wall is cold, the reaction would occur at the wall rather than in the wafer area. Typical parameters used in this step are:

Flow Rates

H₂~ 1.2 l/min.

HCl~ 2 cc / min

PH₃~ 8 cc / min

Temperature

700° – 750°C

Time

75 – 150 minutes

Growth rates achieved were about $0.1 - 0.2\mu$/min. with GaP thickness in the order of $12.6 - 13.3\ \mu$ at 75 minutes and $29.8\ \mu$ at 150 minutes. The resultant processing allows high quality GaP material wth relatively large distances (2–3 mils) between cracks.

To compare results of the heteroepitaxial GaP/Si films with established standard homoepitaxial GaP/GaP films, a series of comparative tests have been run with the following results established:

|  | GaP/GaP | GaP/Si |
|---|---|---|
| 300°K - Doping level | $4.3 \times 10^{16}$ cm$^3$ | $5.1 \times 10^{16}$ cm$^3$ |
| Mobility | 150 cm$^2$/v sec | 150 cm$^2$/v sec |
| 77°K - Doping level | $2.0 \times 10^{11}$ cm$^3$ | $1.8 \times 10^{11}$ cm$^3$ |
| Mobility | 1730 cm$^2$/v sec | 1660 cm$^2$/v sec |
| Dislocation Density (D-pits) | $\sim 10^5$ / cm$^2$ | Graded from interface ($\sim 10^7$ / cm$^2$) To surface region ($10^5$ / cm$^2$) |

It is known that etch pit densities of approximately $10^5$ /cm$^2$ of the D-pit type have no direct effect on the final electroluminescence of the material.

Figure 2:
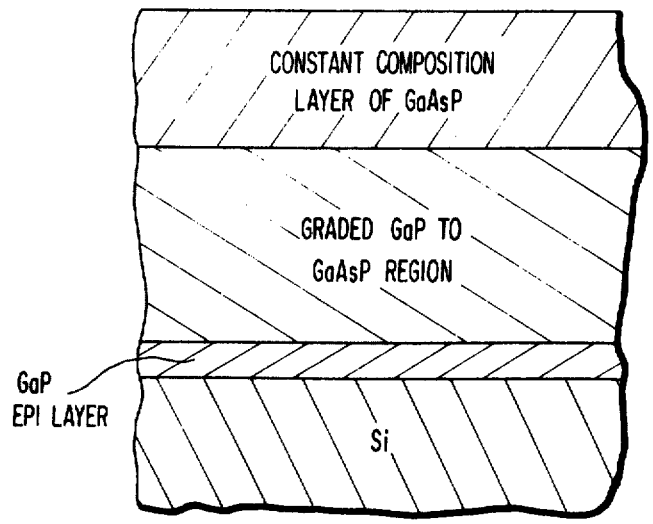
FIG. 2 shows a cross-sectional view of heteroepitaxial GaAsP LED array, produced by the process of the present invention.

During the growth of this second layer, AsH$_3$ is added in a graded manner through the use of an electronically programmed flow meter. This allows the controlled addition of AsH$_3$ to facilitate the growth of any desired band gap GaAsP. The grading step is continued until the design composition of the desired LED is achieved. Then, a constant layer of GaAsP is deposited on this graded layer. FIG. 2 shows a cross-section of such a structure.

Conventionally, such GaAsP layers have been used in the semiconductor industry for producing LED's, but a crucial problem has been cost because only GaAs and GaP could, unitl now, be used as substrates. The use of silicon is obviously preferred, but due to the lattice mismatch, GaAsP cannot be grown on silicon. However, GaAsP can be readily grown on GaP and this invention obviates the need for expensive GaP substrates by first growing a primer layer of GaP on Si. The second step of the process of this invention then utilizes the primed layer to grow the graded GaP for use in the LED. The substitution of Si as the substrate is a material cost saving.

While the invention has been particularly shown and described with reference to the preferred embodiment, it will be understood by those skilled in the art that various changes in form and detail may be made therein without departing from the spirit and scope of the invention.

We claim:

1. A method of making a light emitting diode comprising the steps of:
   pyrolytically depositing a first layer of gallium phosphide on silicon to form a thin epitaxial film;
   depositing a graded second layer of GaP onto the first layer of GaP by the halide transport process with the bandgap of the GaP being altered by the addition of AsH$_3$ until a constant composition layer of GaAsP is achieved; and
   growing a constant composition layer of GaAsP at an appropriate LED wavelength.

2. The method of claim 1 wherein the silicon substrate is first subjected to a high temperature bake cycle in the range of 1100°C for approximately 2 minutes.

3. The method of claim 1 wherein the first layer is formed by pyrolytic deposition to a thickness in the range of 1 – 2 microns in thickness.

4. The method of claim 1 wherein the pyrolytic deposition takes place in a temperature range of 750° to 1000°C.

5. The method of claim 1 wherein the second layer is deposited by the halide transport process to a thickness in the range of 10–20 microns in thickness on the first layer.

6. The method of claim 1 wherein the deposition by the halide transport process is in a temperature range of 700° – 850°C.

* * * * *